United States Patent [19]
Baldwin et al.

[11] Patent Number: 5,154,945
[45] Date of Patent: Oct. 13, 1992

[54] METHODS USING LASERS TO PRODUCE DEPOSITION OF DIAMOND THIN FILMS ON SUBSTRATES

[75] Inventors: Mark W. Baldwin; Arvid G. Waschek, both of Cedar Falls; P. A. Molian, Ames, all of Iowa

[73] Assignee: Iowa Laser Technology, Inc., Cedar Falls, Iowa

[21] Appl. No.: 772,609

[22] Filed: Oct. 8, 1991

Related U.S. Application Data

[63] Continuation of Ser. No. 487,906, Mar. 5, 1990, abandoned.

[51] Int. Cl.$^5$ ............................. B05D 3/06; B01J 3/06
[52] U.S. Cl. ..................................... 427/596; 423/446
[58] Field of Search ................. 427/53.1, 55, 56.1; 423/446, 449, 450, 458

[56] References Cited

U.S. PATENT DOCUMENTS

| | | | |
|---|---|---|---|
| 4,849,199 | 7/1989 | Pinneo | 423/446 |
| 4,892,751 | 1/1990 | Miyake et al. | 427/53.1 |
| 4,938,940 | 7/1990 | Hirose et al. | 423/446 |
| 4,981,717 | 1/1991 | Thaler | 427/53.1 |
| 5,066,515 | 11/1991 | Ohsawa | 427/53.1 |

FOREIGN PATENT DOCUMENTS

| | | |
|---|---|---|
| 59-3016 | 1/1984 | Japan . |
| 61-56282 | 3/1986 | Japan . |
| 62-212210 | 9/1987 | Japan . |
| 62-216997 | 9/1987 | Japan . |
| 1-148791 | 6/1989 | Japan . |

Primary Examiner—Marianne Padgett
Attorney, Agent, or Firm—James C. Nemmers

[57] ABSTRACT

Infrared lasers are used to deposit diamond thin films onto a substrate. In one embodiment, the deposition of the film is from a gas mixture of $CH_4$ and $H_2$ that is introduced into a chemical vapor deposition chamber and caused to flow over the surface of the substrate to be coated while the laser is directed onto the surface. In another embodiment, pure carbon in the form of soot is delivered onto the surface to be coated and the laser beam is directed onto the surface in an atmosphere that prevents the carbon from being burned to $CO_2$.

6 Claims, 1 Drawing Sheet

METHODS USING LASERS TO PRODUCE DEPOSITION OF DIAMOND THIN FILMS ON SUBSTRATES

This is a continuation of application Ser. No. 487,906, filed Mar. 5, 1990, abandoned.

BACKGROUND OF THE INVENTION

Diamond is potentially a very useful material for numerous scientific and engineering applications because it possesses high hardness, has the highest thermal conductivity of any known material, has excellent optical transparency throughout the ultraviolet to infrared range, is chemically inert, has high stiffness and superior acoustical properties, and is biocompatable. Moreover, diamond can be an excellent n- or p-type semiconductor if doped with appropriate impurities.

Because of the unique characteristics of diamond, there are many possible applications of diamond thin films. Some of these are illustrated in the following Table 1:

TABLE 1

Applications of diamond thin films

| Characteristic | Applications |
|---|---|
| High thermal conductivity | Heat sinks for semiconducting devices, heat dissipating printed circuit boards, and minimum laser damage |
| High hole mobility, dopability | n- and p-semiconducting materials, temperature and radiation-resistant power semiconducting devices, transistors in motors and jet engines, Schottky diodes |
| Optical transparency | Coatings for lenses and glasses, infrared windows, high density compact disks, X ray windows and lithography masks |
| Wear resistance, hardness, low friction | Abrasives, drilling tools, bearings for machines and motors, cutting tools, dies and molds, scratch proof coatings on watches, glasses, ceramics and jewelry |
| Chemical inertness | Chemical reactors, inert coatings on nuclear reactor walls, and corrosion-resistant watch cases |
| High sound propagation velocity | Loudspeaker diaphragms, tweeters, and midrangers |
| Biocompatability | Surface improvement of joints, teeth, implants, prosthetic materials, and biosensors |

The most useful form of diamond for the electronics industry would be a film of single-crystal diamond on a nondiamond substrate. Since diamond is both a good thermal conductor and a good semiconductor, diamond microchips could be used successfully in high-speed devices At the present time, diamonds are synthetically produced for most industrial purposes by using one of two procedures. One method is to apply high temperatures and high pressures to carbon containing compounds. However, this method is not suitable for coating many of the substrate materials for which the full benefits of the unique properties of diamond can be best utilized. The second method is to deposit diamond thin films from the gas phase at low pressures using thermal, electric discharge and catalytic methods. Diamond thin films created in this manner on a substrate material use a variety of chemical vapor deposition (CVD) procedures that include the use of plasma, microwave, hot filament, ion beam, and electron beam as energy sources. Typically, a mixture of 0.5 to 2% methane and the balance hydrogen gas is used as the carbon source. The mechanism of diamond deposition occurs because the hydrogen molecules in the gas decompose into atomic hydrogen which subsequently becomes deposited on the substrate as a monolayer. The more reactive forms of carbon such as graphite combine with the atomic hydrogen and are removed, thereby allowing diamond to condense on the substrate surface.

Although the deposition of diamond films has been proven using the above methods, there are many disadvantages of the prior art procedures that prevent diamond films from being successfully and extensively utilized for commercial applications. Some of these disadvantages are:

1. The deposition rates are generally low. A typical value is 1 micron per hour, although The Naval Research Laboratory claims to have formed "good quality, clear crystals" at 50 microns per hour while the Tokyo Institute of Technology claims rates as high as 930 microns per hour.
2. The deposition area covered on the substrate is small. Current technology is limited to 4" diameter optical surfaces.
3. The substrate temperatures must be in the range from 800° C. to around 1000° C. These high temperatures restrict diamond from being deposited on low melting point substrates such as polymers.
4. The process of diamond growth is not yet fully understood.
5. Hydrogen impurity will be present if the substrate temperature is held below 400° C. when using the ion beam technique. The properties of films containing hydrogen do not approach the desirable properties of diamond films.
6. Adhesion of the film to the substrate is insufficient because of the thermal expansion mismatching of diamond with most of the substrates.
7. A smooth surface finish is hard to achieve especially for optical applications.

Because of the forgoing deficiencies in the prior art methods, new methods for producing diamond thin films have been explored in as effort to overcome at least some of the limitations of the existing methods and to improve the quality of diamond films. One such known method is laser-induced chemical vapor deposition (LCVD). In this method, a laser serves as an energy source to decompose the gases and raise the surface temperature of the substrate for deposition. LCVD offers several unique advantages over the other prior art methods:

1. Laser is a clean source of energy which leads to less contamination for diamond growth.
2. A relatively high deposition rate is achieved.
3. A low substrate temperature can be used.
4. The area of deposition can be controlled.
5. Better surface integrity results.
6. Fine microstructures are produced.
7. The method has the capability for using different precursors.
8. Little thermal damage occurs to the substrate.

Lasers deposit thin films by pyrolysis and photolysis mechanisms of breaking the gaseous molecules. In laser pyrolysis, the substrate is heated by a directed laser beam up to the desired temperature by controlling the power and irradiation time of the beam, while the chemical gases decompose by the collisional excitation with the hot surface. The laser-driven reactions are different from those initiated by other CVD sources for the same heat input because of the higher temperatures obtainable in the smaller reaction volume defined by the directed laser beam. In the laser photolysis process, the photons break the chemical bonds of the gaseous molecules which allows the products to get deposited on the substrate. An important requirement in photolysis is the need to match the wave length of the laser beam with the bandgap of the reactants. The bond breaking may be caused by either single or multiphoton dissociation. In general, pyrolysis is more efficient than photolysis.

Because of these capabilities and characteristics of lasers, some prior art researchers have attempted laser-induced CVD for diamond deposition, and the results initially indicated that diamond films were obtained using an ArF-excimer laser beam in a gas mixture of $C_2H_2$ and $H_2$ at a substrate temperature in the range 40° to 800° C. This seemed to be an important improvement in diamond technology because the deposition of the diamond film was claimed to occur at a temperature as low as 40° C. However, the same researchers later indicated that their earlier findings were not correct and that the film observed was a "heat treated carbon black" instead of diamond.

Other prior art researchers have experimented with a system using a mixture of $CCl_4$ and $H_2$ gases that are passed over the substrate and irradiated with a 193 nm ArF laser beam. This gas mixture was apparently chosen instead of $CH_4$ because it absorbs the 193 nm wavelength more efficiently, the binding energy is more appropriate, and it forms reactive radicals. Using a laser power of 8 watts, it was determined that the maximum growth rate of 6 microns per hour occurred at a substrate temperature of 800° C. It is believed that the surface of the film is photoreactive which activated the hydrogen which in turn increased the amount of carbon available for the diamond film.

Amorphous carbon films have been deposited by excimer laser photodissociation of $C_2H_3Cl$ and $CCl_4$ gases at ambient temperature, and recently, researchers have claimed the deposition of carbon films containing a large fraction of diamond by using an excimer laser and carboxylic acids.

Other than the foregoing examples, there are no known prior art teachings of the successful use of lasers to produce diamond thin films on a substrate, but in light of these prior art teachings, it is evident that laser CVD is a technology that has potential for diamond deposition. However, the prior art LCVD methods all require relatively long processing times and supplementary heating of the substrate in order to attain the substrate temperature necessary to produce diamond deposition. Moreover, the prior art processes must take place in an enclosure to confine the gases from which the diamond film is formed. These are obvious limitations on the use of the LCVD methods. In addition, the prior art teachings have not established optimum laser parameters and other process variables for growing diamond thin films using $CH_4/H_2$ precursors, nor does the prior art contain any teaching on the use of lasers other than excimer lasers. There is therefore a definite need for improved methods of utilizing the obvious advantages of laser technology for diamond deposition.

SUMMARY OF THE INVENTION

In one embodiment of the invention, a 1200 Watt $CO_2$ gas laser is used as an energy source to deposit a diamond thin film onto a substrate from a gas mixture of $CH_4$ and $H_2$ in a chemical vapor deposition chamber. Using an unfocused $CO_2$ laser beam with a power density of 3000 watts/cm$^2$ supplied at normal incidence to the substrate surface, a diamond thin film can be deposited in approximately two hours, with the substrate temperature being raised to about 600° C. In another embodiment, the process is performed without the use of a vapor deposition chamber. In this embodiment, pure solid carbon particles, in the form of soot, are delivered onto the surface of the substrate to be coated and a $CO_2$ gas laser beam is directed at normal incidence onto the surface. Movement between the substrate and the laser beam causes momentary heating of a very small area of the substrate surface with minimun energy input, resulting in a diamond deposit on the surface with almost no disturbance of the substrate.

DESCRIPTION OF THE PREFERRED EMBODIMENTS OF THE INVENTION

The invention has identified the process variables required for using laser chemical vapor deposition (LCVD) without the disadvantages of the prior art methods when depositing diamond on substrates.

The specifications of the laser system used in the method of the first embodiment of the invention are set forth in the following Table 2:

TABLE 2

| Laser system | |
| --- | --- |
| Laser type | $CO_2$ |
| Power, watts | 100–1200 |
| Pulse length | millisec to continuous |
| Pulse repetition rate | continuous to 100 Hz |
| Beam size | 0.75" |
| Energy distribution | Gaussian |
| Manufacturer | Photon Sources Model V1200 |

Figure 1:
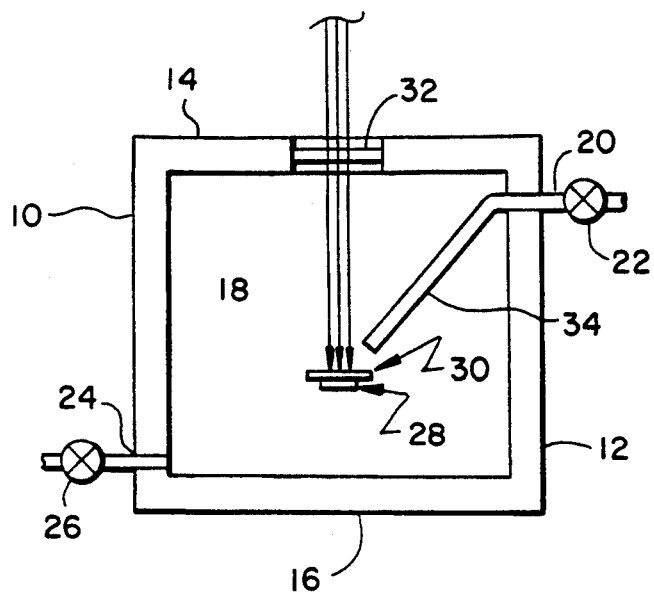
FIG. 1 is a schematic diagram illustrating the apparatus used in conducting the method of the first embodiment of the invention.

The $CO_2$ laser has a wavelength of 10,600 nm in the infrared range of the electromagnetic spectrum, and when used in the method of the invention, the laser is operated in pulsed and continuous wave modes. A 5" focal length lens and an optical integrator also are sometimes used. The chemical vapor deposition (CVD) chamber used in performing the method of the invention may be of any suitable type, but preferably is made of stainless steel. A schematic diagram of the CVD chamber is shown in FIG. 1. The chamber includes sidewalls 10 and 12 and a top wall 14 and bottom wall 16 that provide a sealed chamber 18. A port (not shown) is provided in one of the walls for connection to a vacuum pump (not shown) so that a vacuum can be created in the chamber 18 prior to the diamond deposition process. A gas inlet port 20 is provided in sidewall 12 with a suitable valve 22 controlling the flow of gas through port 20 into the chamber 18. Similarly, a gas outlet port 24 is provided in sidewall 10 with a suitable valve 26 controlling the discharge of gas from the chamber 18 through outlet port 24. Ports 20 and 24 provide for the continuous flow of the desired gas through the chamber 18 during the deposition process. A thermocouple 28 is used to measure the temperature of the substrate 30 that is positioned in chamber 18 for coating with diamond. Connection to thermocouple 28 inside of chamber 18 is provided through any one of the walls of the chamber 18 in any suitable manner. The laser beam from a laser (not shown) of any suitable type is directed onto the surface of the substrate 30 to be coated through a window 32 in the top wall 14 so that the laser beam will be directed normally to the surface of the substrate 30. An example of a laser suitable for use in the method of the invention is set forth in Table 2, above. The window 32 is formed of any suitable material such as ZnSe. The gas is preferably directed through a tube 34 so as to impinge on the surface of substrate 30 where the laser beam is incident Thermocouple 28 is in contact with the substrate 30 and the pressure in the chamber is monitored in any suitable manner.

The substrate 30 can be of any desired material as long as it is capable of withstanding the surface temperature created during the deposition process. Since the method of the invention creates much lower temperatures in the substrate itself, many materials not previously capable of being coated with diamond can be coated using the principles of the invention. We have used successfully gallium arsenide (GaAs) and silicon (Si) for substrate materials. GaAs of a thickness of 0.0155" and with an orientation of (100) can be used. The GaAs substrate may also be doped with small amounts of silicon if desired. Silicon with about the same thickness and (111) orientation may also be used as the substrate 30 because it has been proven by other CVD techniques that silicon is a suitable substrate for diamond deposition. The substrates are preferably polished with 3 to 6 microns diamond powder prior to commencement of the laser deposition process.

The method of the invention is commenced by first evacuating the chamber 18 to $10^{-6}$ torr and then introducing a mixture of 2% $CH_4$ and 98% $H_2$ gas through the inlet port 20 into the reaction area above the substrate 30. The gas pressure and the flow rate are preferably in the ranges of 50-100 torr and 2-5 l/hr. The other process variables used in practicing the process of the invention should be within the following parameters:
Laser power: 100 to 1200 watts with $CO_2$ laser
Beam size: unfocused $CO_2$ beam = 0.75" unfocused $CO_2$ beam = 0.25" × 0.25" square focused $CO_2$ beam = 0.004" using a 5" F.L.lens
Beam mode: continuous wave and pulsed (1 to 100 Hz)
Resistance heating of the substrate: 20° to 800° C.
Deposition time: 15 minutes to 2 hours With the gas flowing into the reaction area above the substrate 30, the laser beam is then directed perpendicular to the surface of the substrate 30, thus producing the diamond film on the surface of the substrate 30. The deposited film thus produced can be confirmed to be diamond by use of a scanning electron microscope, X-ray analysis, scratch test or Raman microprobe spectroscopy.

In some instances and with certain substrates, it may be necessary to gradually increase the laser power from 0 to 1200 watts over a period of time, such as an hour, in order to prevent the shattering of the substrate 30.

One of the major problems in using a $CO_2$ laser is that the chamber 18 becomes very hot in 30 minutes of deposition time. Since diamond nucleation requires longer time than 30 minutes when using the method of this first embodiment, the walls of chamber 18 may be fitted with vertical aluminum fins for heat dissipation. Also, air jets may be directed onto the chamber walls to assist in reducing the chamber temperature. With such physical modifications to chamber 18, high quality, fine crystalline diamond deposits on the substrate 30 can be produced.

In the laser thermal deposition process of the invention, the laser beam serves to heat the surface of substrate 30 and to decompose the gaseous molecules, thus leading to the necessary chemical reactions and physical processes required for the deposition of the diamond film on the substrate. The diamond growth mechanism using laser-induced CVD is therefore probably a result of the laser pyrolytic processes. (Photochemical reactions are ruled out with $CO_2$ lasers because the decomposition of $CH_4$ is possible only with photons whose wavelength is less than 144 nm.) In pyrolytic LCVD, lasers directed normally onto the surface of the substrate induce chemical reactions heterogeneously at the gas-solid interface. It is believed that with normal incidence of laser beams, diamond nucleation and growth require heterogeneously activated reactions in which the reaction products are diffusion-driven towards the substrate surface giving rise to the thin films. In heterogeneously activated LCVD, the laser light is absorbed by the $CH_4/H_2$ gases and by the substrate resulting in high heat at the interface of the gas and substrate surface. The absorption spectra of $H_2$ molecules shows that $H_2$ molecules are capable of absorbing large amounts of 10.6 micron IR radiation. If the gas mixture is absent, the temperature rise of the substrate will exceed 1000° C. within a few milliseconds of laser irradiation time. However, with continuous gas flow over the substrate, the temperature rise of the substrate will reach only about 580° C., even after continuous radiation by the $CO_2$ laser beam at 1200 watts power for more than 2 hours.

The laser energy absorbed by the $CH_4/H_2$ gas mixture causes the gas to be in the excited, high-energy state. When the excited gases come in contact with the hot substrate, the adsorption of a $CH_4/H_2$ gaseous layer occurs on the substrate surface. This is followed by a reaction to form adsorbed layers of atomic hydrogen. The adsorbed hydrogen atoms then form clusters which grow and coalesce to form a continuous film. Once a monolayer of atomic hydrogen is formed, nucleation of carbon takes place as a result of the decomposition of CH. The free carbon atoms form clusters and provide nucleation centers for further film growth. Although the carbon can be deposited as diamond or graphite or other forms of carbon such as chaoite, ionsdaleite and carbyne, the probability of diamond deposition is more likely because the atomic hydrogen etches away other forms of carbon.

Using the method of this first embodiment, we have found that an unfocused $CO_2$ laser beam with a power density of 3000 watts/cm$_2$ is capable of depositing a diamond film on the substrate surface in 2 hours of time if the laser beam is continuously applied at normal incidence to the substrate surface in the presence of $CH_4$ and $H_2$ gases. This is a major improvement over prior art methods which require considerably longer processing times. Also, it is significant that the substrate temperature will reach only about 600° C., thereby allowing diamond deposition to be used with many substrate materials never before thought possible. Thus, the deposition of superior quality, fine crystals of diamond on a variety of non-diamond substrates using laser induced CVD of $CH_4/H_2$ mixture can be achieved more quickly and at a lower cost using the principles of the invention.

Figure 2:
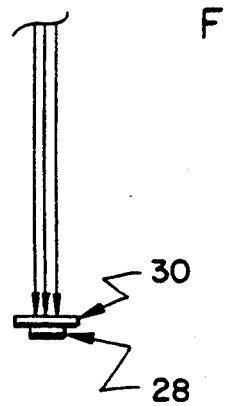
FIG. 2 is a schematic diagram similar to FIG. 1 but showing the second embodiment of the invention.

FIG. 2 illustrates the second embodiment of the invention, in which the method of laser-induced diamond deposition is performed without the necessity of an environmental chamber. In this embodiment, rather than flowing a gas over the upper surface of substrate 30 in a confined environment, particles of pure carbon, in the form of soot, are delivered to the surface of the substrate 30, which can be positioned in the open atmosphere. The laser beam is directed normally toward the substrate surface, and relative movement is created between the laser beam and the substrate 30. This produces momentary heating of a very small area (0.05 $mm^2$ for 0.01 sec) on the substrate surface with a minimum energy input (as low as 110 watts). The method of this embodiment results in a diamond deposit with almost no disturbance of the substrate. Since the method is performed at atmospheric conditions, and no supplemental heating or pressurization of the substrate is required, the method is a relatively easy to perform and clearly a significant advance over the prior art methods. Moreover, the method of this embodiment eliminates the requirement for using hydrogen gas, is very much faster and requires a minimum energy input. However, in some instances, it may be necessary to conduct the deposition process of this embodiment in an atmosphere that prevents the carbon from being burned to $CO_2$ by using a cover gas of either $CO_2$ or helium. Even if such a cover gas is used, the method can be performed in the open atmosphere.

Having thus described our invention in connection with preferred embodiments thereof, it will be evident to those skilled in the art that various revisions and modifications can be made to the preferred embodiments disclosed herein without departing from the spirit and scope of the invention. It is our intention, however, that all such revisions and modifications that are obvious to those skilled in the art will be included within the scope of the following claims.

What is claimed is as follows:

1. A method for depositing diamond on the surface of a substrate using an infrared laser, said method comprising: locating the substrate having a surface to be coated in a non-enclosed environment containing no means other than the infrared laser for heating the substrate; causing carbon particles continuously to be in contact with the surface of the substrate during the deposition; delivering an inert cover gas to the surface to control carbon burning; directing the infrared laser onto the surface of the substrate to be coated while said carbon particles is in contact with said surface; and continuing to direct the infrared laser onto the carbon particles and the substrate surface for a sufficient amount of time to cause the carbon to be deposited in the form of diamond on the substrate surface without heating the substrate a measurable amount.

2. The method of claim 1 in which the non-enclosed environment is the open atmosphere and the method steps are performed under normal atmospheric conditions.

3. The method of claim 2 in which the laser and substrate are continuously moved relative to each other to produce only momentary heating of an irradiated area on the substrate.

4. The method of claim 3 in which the only source of energy input is the infrared laser.

5. The method of claim 1 in which the inert cover gas is continuously flowed over the surface of the substrate that is to be coated while the carbon particles are in contact with the substrate surface, and the flow of inert cover gas is continued during the deposition process.

6. The method of claim 5 in which the cover gas is helium.

* * * * *